(12) United States Patent  
Stoll et al.

(10) Patent No.: US 9,318,667 B2
(45) Date of Patent: Apr. 19, 2016

(54) METHOD FOR PRODUCING A LIGHT-EMITTING DIODE AND LIGHT-EMITTING DIODE

(75) Inventors: Ion Stoll, Tegernheim (DE); Hans-Christoph Gallmeier, Regensburg (DE); Kirstin Petersen, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 44 days.

(21) Appl. No.: 14/240,481

(22) PCT Filed: Jul. 16, 2012

(86) PCT No.: PCT/EP2012/063872
§ 371 (c)(1),
(2), (4) Date: Apr. 21, 2014

(87) PCT Pub. No.: WO2013/029862
PCT Pub. Date: Mar. 7, 2013

(65) Prior Publication Data
US 2014/0231855 A1    Aug. 21, 2014

(30) Foreign Application Priority Data
Aug. 29, 2011  (DE) .................... 10 2011 111 980

(51) Int. Cl.
*H01L 33/00* (2010.01)
*H01L 21/30* (2006.01)
*H01L 33/50* (2010.01)

(52) U.S. Cl.
CPC ............ *H01L 33/502* (2013.01); *H01L 33/504* (2013.01); *H01L 33/508* (2013.01); *H01L 2924/0002* (2013.01); *H01L 2933/0041* (2013.01)

(58) Field of Classification Search
CPC .. H01L 51/5036; H01L 33/504; H05B 33/14; H05B 33/22; H05B 33/28; H05B 33/086; H05B 33/0863; H05B 33/0869
USPC ......... 257/98, E21.211, E33.055; 438/15, 29; 313/46, 495, 501
See application file for complete search history.

(56) References Cited

U.S. PATENT DOCUMENTS 6,358,653 B1 * 3/2002 Turberfield .......... G02B 6/1225 430/1
7,078,732 B1    7/2006 Reeh et al.
(Continued)

FOREIGN PATENT DOCUMENTS

DE    10225778       4/2003
DE    102004021231   12/2005
(Continued)

OTHER PUBLICATIONS

Fix—Definition of fix by Merriam-Webster.pdf.*
(Continued)

*Primary Examiner* — Kimberly Rizkallah
*Assistant Examiner* — Brian Turner
(74) *Attorney, Agent, or Firm* — DLA Piper LLP (US)

(57) ABSTRACT

A method of producing a light-emitting diode includes providing at least one light-emitting diode chip, providing a suspension comprising a solvent and particles of at least one luminescent material, arranging the at least one light-emitting diode chip in the suspension, electrophoretically depositing the particles on an outer face of the at least one light-emitting diode chip, and completing the light-emitting diode.

11 Claims, 4 Drawing Sheets

(56) References Cited

U.S. PATENT DOCUMENTS

| | | | |
|---|---|---|---|
| 2001/0001193 A1* | 5/2001 | Nemelka | 204/485 |
| 2002/0185965 A1 | 12/2002 | Collins, III et al. | |
| 2002/0187571 A1* | 12/2002 | Collins et al. | 438/29 |
| 2008/0230752 A1* | 9/2008 | Bower et al. | 252/584 |
| 2009/0039365 A1 | 2/2009 | Andrews et al. | |
| 2009/0173957 A1 | 7/2009 | Brunner et al. | |
| 2009/0256163 A1 | 10/2009 | Chakraborty | |
| 2009/0272998 A1* | 11/2009 | Berben et al. | 257/98 |
| 2010/0123386 A1 | 5/2010 | Chen | |
| 2010/0155750 A1 | 6/2010 | Donofrio | |
| 2011/0018017 A1* | 1/2011 | Bierhuizen et al. | 257/98 |

FOREIGN PATENT DOCUMENTS

| | | |
|---|---|---|
| DE | 102006024165 | 11/2007 |
| DE | 102007042642 | 3/2009 |
| DE | 102008048653 | 4/2010 |
| EP | 2105976 | 9/2009 |
| TW | 201003995 | 1/2010 |
| TW | 201026138 | 7/2010 |
| WO | 2007/023439 | 3/2007 |

OTHER PUBLICATIONS

Kitabatake T. et al.: "Electrophoreticdeposition of Eu2+ doped Ca-α-SiAlON phosphor particles for packaging of flat pseudo-white light emitting devices," *Journal of the Ceramic Society of Japan*, 2008, pp. 740-743 "Electrophoretic deposition," www.wikipedia.com.

English translation of Taiwanese Notification for the Opinion of Examination dated Jun. 25, 2015 from corresponding Taiwanese Patent Application No. 101130973.

* cited by examiner

METHOD FOR PRODUCING A LIGHT-EMITTING DIODE AND LIGHT-EMITTING DIODE

TECHNICAL FIELD

This disclosure relates to a method of producing a light-emitting diode and a light-emitting diode produced by such a method.

BACKGROUND

DE 102004021231 A1 describes a method of producing a light-emitting diode. There is nonetheless a need to provide a method of producing a light-emitting diode which is particularly cost-effective to implement.

SUMMARY

We provide a method of producing a light-emitting diode including providing at least one light-emitting diode chip, providing a suspension comprising a solvent and particles of at least one luminescent material, arranging the at least one light-emitting diode chip in the suspension, electrophoretically depositing the particles on an outer face of the at least one light-emitting diode chip, and completing the light-emitting diode.

We also provide a light-emitting diode including at least one light-emitting diode chip comprising at least one outer face through which electromagnetic radiation generated in the light-emitting diode chip when said light-emitting diode chip is in operation leaves the light-emitting diode chip, and particles of at least one luminescent material electrophoretically deposited onto the outer face of the light-emitting diode chip.

We further provide a method of producing a light-emitting diode including providing at least one light-emitting diode chip, providing a suspension comprising a solvent and particles of at least one luminescent material, arranging the at least one light-emitting diode chip in the suspension, electrophoretically depositing the particles on an outer face of the at least one light-emitting diode chip, providing a further suspension comprising a solvent and particles of at least one further luminescent material, arranging the at least one light-emitting diode chip at least in part in the suspension, electrophoretically depositing the particles of the at least one further luminescent material on an outer face of the at least one light-emitting diode chip, wherein the particles of the at least one luminescent material and the particles of the at least one further luminescent material on the outer face of the at least one light-emitting diode chip form a pattern of first regions with particles of a first luminescent material and second regions with particles of a second luminescent material.

DETAILED DESCRIPTION

We provide a method of producing a light-emitting diode, wherein, in one method step, at least one light-emitting diode chip is provided. A plurality of light-emitting diode chips are preferably provided. The plurality of light-emitting diode chips are in particular of identical construction, i.e. within the bounds of manufacturing tolerances the light-emitting diode chips have the same physical structure and within the bounds of manufacturing tolerances the light-emitting diode chips emit electromagnetic radiation of the same spectrum when in operation. The light-emitting diode chips may be based on a III-V compound semiconductor material, in particular on a nitride compound semiconductor material. The light-emitting diode chips, for example, generate UV radiation and/or blue light when in operation.

A III-V compound semiconductor material comprises at least one element from main group three such as, for example, B, Al, Ga or In, and one element from main group five such as, for example, N, P or As. In particular, the term "III-V compound semiconductor material" encompasses the group of binary, ternary or quaternary compounds containing at least one element from main group three and at least one element from main group five, for example, nitride and phosphide compound semiconductors. Such a binary, ternary or quaternary compound may moreover comprise, for example, one or more dopants and additional constituents.

"Based on nitride compound semiconductor material" means that a semiconductor layer sequence or at least part thereof, particularly preferably at least one active zone provided to generate radiation and/or the growth substrate wafer, comprises a nitride compound semiconductor material, preferably $Al_nGa_mIn_{1-n-m}N$ or consists thereof, wherein $0 \leq n \leq 1$, $0 \leq m \leq 1$ and $n+m \leq 1$. This material need not necessarily exhibit a mathematically exact composition according to the above formula. Instead, it may, for example, comprise one or more dopants and additional constituents. For simplicity's sake, however, the above formula includes only the fundamental constituents of the crystal lattice (Al, Ga, In, N), even if these may in part be replaced and/or supplemented by small quantities of further substances.

The at least one light-emitting diode chip comprises an outer face which limits the light-emitting diode chip outward. When the light-emitting diode chip is in operation, at least some of the electromagnetic radiation generated in the light-emitting diode chip exits through at least part of the outer face.

The method may comprise a method step in which a suspension is provided which contains a solvent and particles of at least one luminescent material.

The solvent may, for example, be water or an organic solvent. Suitable organic solvents are, for example, alcohols such as, for example, ethanol or 2-propanol, ketones, aldehydes, aromatic solvents such as, for example, benzene, toluene, xylenes, and halogenated aliphatic hydrocarbons. Mixtures of at least two of the stated solvents may also be used as the solvent.

The suspension further comprises particles of at least one luminescent material. The first luminescent material may, for example, be a ceramic luminescent material such as one of the following luminescent materials: rare earth metal-doped garnets, rare earth metal-doped alkaline earth metal sulfides, rare earth metal-doped thiogallates, rare earth metal-doped aluminates, rare earth metal-doped orthosilicates, rare earth metal-doped chlorosilicates, rare earth metal-doped alkaline earth silicon nitrides, rare earth metal-doped oxynitrides and rare earth metal-doped aluminium oxynitrides, rare earth metal-doped silicon nitrides or rare earth metal-doped sialons.

Particularly suitable luminescent materials are garnets, aluminates, nitrides and mixtures of at least two of these luminescent materials. Particles of the following luminescent materials may be used, for example: $(Y,Lu)_3(Al,Ga)_5O_{12}$: $Ce^{3+}$, $CaAlSiN_3:Eu^{2+}$, $(Ba,Sr)_2Si_5N_8:Eu^{2+}$ In addition, it is possible for the luminescent material to be a "nano-luminescent material" in which particles of the luminescent material may have diameters of, for example, at least 1 nm to at most 100 nm. Nano-luminescent materials are described in US 2009/0173957, for example, the subject matter of which is hereby explicitly incorporated by reference.

It is also possible for the luminescent material to be formed of quantum dots. Suitable materials are in this case PbS or CdS, for example. The quantum dots may in particular be based on III-V or II-VI compound semiconductor materials. A II-VI compound semiconductor material comprises in particular at least one element from main group two such as, for example, Be, Mg, Ca or Sr, and one element from main group six such as, for example, O, S or Se. In particular, a II-VI compound semiconductor material comprises a binary, ternary or quaternary compound which comprises at least one element from main group two and at least one element from main group six. Such a binary, ternary or quaternary compound may moreover comprise, for example, one or more dopants and additional constituents. The II-VI compound semiconductor materials, for example, include: ZnO, ZnMgO, CdS, ZnCdS, MgBeO.

The luminescent material is in this case suitable in particular for down-conversion, i.e. primary radiation from a first wavelength range is absorbed by the luminescent material and secondary radiation from a second wavelength range is emitted by the luminescent material, the second wavelength range comprising wavelengths larger than the first wavelength range.

The method may comprise a method step in which the at least one light-emitting diode chip is arranged in the suspension. If a plurality of light-emitting diode chips is provided, the plurality of light-emitting diode chips is preferably arranged jointly in the suspension. "Jointly" here means, for example, that all light-emitting diode chips are arranged at identical times in the suspension and thus coating of the light-emitting diode chips need not take place in sequence, but rather simultaneously.

The light-emitting diode chips arranged in suspension are wetted by the suspension at least in places, i.e. the suspension wets and directly adjoins, at least in places, the outer face of the at least one light-emitting diode chip. It is possible, in this respect, for the at least one light-emitting diode chip to be arranged only partly in the suspension, i.e. part of the light-emitting diode chip, for example, a radiation passage face is wetted by the suspension, while another part of the light-emitting diode chip, for example, electrical terminal areas of the light-emitting diode chips, are not arranged in the suspension. It is additionally possible for at least one of the light-emitting diode chips, preferably all the light-emitting diode chips, to be arranged completely in the suspension.

The particles of the at least one luminescent material may be deposited electrophoretically from the suspension on an outer face of the at least one light-emitting diode chip. To this end, the at least one light-emitting diode chip is electrically contacted, for example, so constituting a first electrode. A second electrode, the counter-electrode, is mounted at another point in the suspension. The particles in the suspension, for example, bear charges on their surface. By application of an electrical voltage, the particles of the at least one luminescent material move in the electrical field in the direction of the electrically conductive parts, covered by the suspension, of the at least one light-emitting diode chip. The particles of the at least one luminescent material are then deposited on the electrically conductive parts of the light-emitting diode chip.

The light-emitting diode may be provided in a final method step. This may take place, for example, in that the light-emitting diode chips are arranged in a package of the light-emitting diode and electrically conductively connected to electrical connection points or conductor tracks of the package.

The method may comprise the following steps:
providing at least one light-emitting diode chip,
providing a suspension comprising a solvent and particles of at least one luminescent material,
arranging the at least one light-emitting diode chip in the suspension,
depositing the particles electrophoretically on an outer face of the at least one light-emitting diode chip,
completing the light-emitting diode.

The completed light-emitting diode comprises at least one light-emitting diode chip in which particles of at least one luminescent material have been deposited electrophoretically on at least one part of the light-emitting diode chip. Blue light generated by the light-emitting diode chip when the light-emitting diode is in operation mixes, for example, with yellow and/or green and/or red light emitted by the particles of the at least one luminescent material. The light-emitting diode may then be suitable for radiating white light when in operation.

In a method described here, the layer deposited on the at least one light-emitting diode chip may advantageously be formed with particles of at least one luminescent material purposefully in relation to the composition, structure and thickness thereof by influencing the electrophoretic deposition process parameters. For example, the density of the particles of the luminescent material deposited on the outer face of the light-emitting diode chips, may be increased by increasing the voltage during electrophoretic deposition. This is the case in particular if the arrangement of the particles changes with a change in voltage. For example, the deposition rate and thus the thickness of the deposited layer may be increased by increasing the voltage. The thickness of the deposited layer of particles of the at least one luminescent material may be very precisely controlled and adjusted by process parameters such as electrical voltage, electrode spacing during electrophoretic deposition, temperature and deposition time. In this way, it is possible to set a desired degree of conversion for the light converted by the luminescent material.

In contrast to alternative methods of applying particles of a luminescent material to the outer face of a light-emitting diode chip such as, for example, potting the light-emitting diode chips with a matrix material such as silicone containing particles of a luminescent material, or application of plates with or of a luminescent material on parts of the outer face of a light-emitting diode chip, the method may be performed simultaneously for a plurality of light-emitting diode chips and thus particularly cost-effectively.

We further provided a light-emitting diode. The light-emitting diode may be produced using a method described here, i.e. all the features disclosed in relation to the method are also disclosed in relation to the light-emitting diode and vice versa.

The light-emitting diode may comprise at least one light-emitting diode chip comprising at least one outer face through which electromagnetic radiation generated in the light-emitting diode chip when the light-emitting diode chip is in operation leaves the light-emitting diode chip. The outer face may, for example, be formed by a major face of the light-emitting diode chip. Particles of at least one luminescent material are deposited electrophoretically onto the outer face or at least parts thereof. The electrophoretically deposited layer of particles may be clearly distinguished, for example, by electron microscopy from layers with particles of at least one luminescent material which are applied to the outer face using other methods such as, for example, sol-gel methods. The feature "electrophoretically deposited" is therefore a structural feature suitable to characterize the subject matter, i.e. the light-emitting diode.

The following examples relate both to the method of producing a light-emitting diode and the light-emitting diode itself. The following features are thus disclosed both for the method described herein and for the light-emitting diode described herein.

The light-emitting diode chips may be in the form of an assembly during electrophoretic deposition and may be singulated into individual light-emitting diode chips after the electrophoretic deposition. The assembly may, for example, be a wafer assembly, i.e. the light-emitting diode chips, grown epitaxially, for example, are not singulated into individual chips before the electrophoretic deposition, but rather the whole wafer is arranged at least in places in a suspension of particles of at least one luminescent material and solvents and coated electrophoretically with the particles. The assembly may then be singulated into individual light-emitting diode chips, for example, by scribing and breaking Side faces of the coated light-emitting diode chips may then display traces of the singulation process in the region of the layer of particles of at least one luminescent material.

The assembly which may be the form taken by the light-emitting diode chips during electrophoretic deposition may moreover be an "artificial wafer", i.e. the light-emitting diode chips are first singulated from the wafer assembly and applied to an auxiliary carrier prior to electrophoretic deposition. The light-emitting diode chips may be applied, for example, presorted to this auxiliary carrier. The light-emitting diode chips may be presorted, for example, in terms of the spectrum of the light they generate when in operation. In other words, binning the light-emitting diode chips may proceed before the electrophoretic deposition of the particles of the at least one luminescent material. In this way, light-emitting diode chips coated with luminescent material are produced which, due to their very similar primary radiation and the uniform conditions during electrophoretic deposition of the particles of the at least one luminescent material, do not differ or barely differ in terms of the mixed light emitted thereby when in operation.

Each light-emitting diode chip may be arranged in a package during electrophoretic deposition. The light-emitting diode chips may in this respect again be in the form of an assembly. For example, a plurality of light-emitting diode chips are in the form of an assembly in a single package. It is moreover possible for a plurality of packages each with at least one light-emitting diode chip to be introduced as an assembly into the suspension at least in places. To this end, the packages may be arranged, for example, on a common auxiliary carrier. The package may be in the form, for example, of a connection carrier such as, for instance, a metal-core board, a circuit board, a printed circuit board (PCB), a metallized ceramic carrier or the like. It is also possible for the package to be formed of a lead frame encapsulated in plastics by injection molding. The package may moreover comprise a cavity, for example, in which at least one of the light-emitting diode chips is arranged.

Electrophoretic deposition of the particles may proceed in places on an outer face of the package, i.e. the particles are then not only deposited on an outer face of the light-emitting diode chip, but rather the particles are also deposited on uncovered conductor tracks, connection points or other electrically conductive parts of the outer face of the package. In this way, these regions of the package may be coated with the luminescent material. Radiation emitted by the light-emitting diode chip when in operation, which impinges unconverted on areas coated in this way, may undergo conversion. In this way, the emission surface of the converted fraction of the light generated by the light-emitting diode when in operation may advantageously be enlarged.

An electrically insulating protective material may be applied to parts of the outer face of each light-emitting diode chip and/or of the package prior to electrophoretic deposition and may be removed after the electrophoretic deposition. Particles of the at least one luminescent material may be barely deposited or not deposited at all during electrophoretic deposition in the region of this electrically insulating protective material. If it is not desirable, for example, for electrically conductive areas of the chip such as, for example, contact layers or bond pads, or electrically conductive regions such as connection points and conductor tracks of the package to be covered by the particles of the luminescent material, these areas may be covered with the electrically insulating protective material prior to deposition. The electrically insulating protective material is, for example, a photoresist. The photoresist covers parts of the outer face of each light-emitting diode chip and/or of the package. Points of the photoresist not intended to cover the light-emitting diode chips and/or the package can be exposed and wet-chemically removed. Where the photoresist remains as an electrically insulating protective material, no luminescent material is deposited during the subsequent electrophoretic deposition. The photoresist or the electrically insulating protective material may then be removed. The points from which the electrically insulating protective material is removed are then free of particles of the at least one luminescent material.

The following method steps may be performed after removal of the electrically insulating protective material and before completion of the light-emitting diode:

First, a further suspension is provided which contains a solvent and particles of at least one further luminescent material. At least one of the further luminescent materials differs from the luminescent materials contained in the first suspension. The solvent may be a solvent which is identical to or different from the solvent selected for the first suspension. The at least one light-emitting diode chip, which is already coated at least in places with particles of the at least one luminescent material, is then arranged in the suspension.

Further electrophoretic deposition of the particles of the at least one further luminescent material on the outer face of the at least one light-emitting diode chips then takes place. In other words, in this example the at least one light-emitting diode chip is coated in succession with at least two different luminescent materials. In this case, the particles of the further luminescent material may in particular be deposited only at those points of the outer face of the at least one light-emitting diode chips from which the electrically insulating protective material has been removed.

Points of the outer face where particles of the at least one luminescent material have already been deposited may be made electrically insulating by these particles and thus no longer suitable for accepting further particles of the at least one further luminescent material. In this way, for example, particles of two different luminescent materials may be applied to the outer face of light-emitting diode chips in a pattern predetermined by the previous structuring of the electrically insulating protective material. One of the luminescent materials may, for example, emit red light, while another of the luminescent materials may emit green light. Very generally, the luminescent material and the further luminescent material may differ with regard to the color of the light emitted thereby.

For example, the electrically insulating protective material, which is for instance a photoresist, may be used to generate a chessboard pattern of exposed and unexposed areas on a major face of a light-emitting diode chip. The exposed areas may, for example, be wet-chemically removed, resulting in areas covered with electrically insulating protective material and uncovered areas. A first luminescent material in the form of particles is then deposited on the electrically conductive, uncovered areas. The remaining electrically insulating protective material is then removed, for example, in a second wet chemical step, and a second luminescent material is deposited in the form of particles. In this way, the light-emitting diode chip comprises a luminescent material layer formed with regions which differ in terms of their luminescent material composition. In this way, it is in particular possible to reduce reabsorption of light emitted by one luminescent material by another luminescent material. The result is a particularly efficient light-emitting diode chip.

An electrically conductive protective material may be applied to each electrical connection point on an outer face of each light-emitting diode chip before electrophoretic deposition and, after electrophoretic deposition, the particles deposited on the electrically conductive protective material are removed by partial removal of the electrically conductive protective material. The electrical connection point is a bond pad, for example. An electrically conductive protective material, for example, in the form of metal beads, for instance gold bumps, can be applied to the bond pad. During subsequent electrophoretic deposition, particles of the luminescent material or of the further luminescent material are deposited on the electrically conductive protective material. Next, the electrically conductive protective material is removed at least in part, for example, by grinding. This uncovers an electrical contact for connection of the light-emitting diode chip. Partial removal may proceed simultaneously for all light-emitting diode chips while the light-emitting diode chips are still in the form of an assembly. This results in a particularly efficient method.

The particles of the at least one luminescent material and the particles of the at least one further luminescent material on the outer face of the at least one light-emitting diode chip may form a pattern of first regions with particles of a first luminescent material and second regions with particles of a second luminescent material. The first and second luminescent materials may in this case be different from one another and emit light of different colors, for example. A pattern here means both a regular arrangement of regions on the outer face of the light-emitting diode chips and an irregular arrangement of at least two different regions.

It is furthermore possible for the pattern to comprise third, fourth or further regions in which particles of further luminescent materials are arranged. It is moreover possible for the pattern to comprise unfilled regions in which no luminescent material is arranged. For instance, an outer face of the light-emitting diode chip may, for example, be structured in regions in which the primary radiation generated by the light-emitting diode chip when in operation is converted fully into colored light by at least one first luminescent material. Other regions may be free of a luminescent material in which case the primary radiation emerges unconverted.

All in all, mixed light may also be generated in this way.

When viewed in plan view onto the outer face, the regions may, for example, be rectangular, square, round, circular or in stripes. For example, each region forms a quadrilateral. The size of the regions may be adapted to the requirements for the light emitted by the light-emitting diode when in operation. It is for instance possible for the regions to have diameters of at least 1 µm to at most 100 µm. If the regions are selected to be particularly large, for example, in the range from at least 100 µm or more, color patterns may be produced which are discernible to the naked eye. This also results, for example, in the possibility of generating simple symbols such as letters or pictograms by the regions and projecting them, for example, via an optical element such as a lens of the light-emitting diode. In this case, the pattern need not be a regular sequence of regions.

It is additionally possible for the regions to be of very small diameter, for example, in the range of the wavelength of the primary radiation emitted by the light-emitting diode chip when in operation. This is possible in particular when nano-luminescent materials and/or quantum dots are used as the luminescent material. With such small regions it is possible, for example, for the pattern to form a photonic crystal. In this way, scattering due to the different refractive indices at the material interfaces of the layers formed by the particles of luminescent materials, for example towards the light-emitting diode chip or into the surrounding medium (for example, potting such as silicone), may be virtually completely avoided. This leads to elevated brightness of the light emitted by the light-emitting diode when in operation.

The particles may be fixed on the outer face of the light-emitting diode chip after the electrophoretic deposition. After fixing, a mechanically strong bond is produced between the particles of the luminescent material and the light-emitting diode chip, which bond is not broken during further processing of the light-emitting diode chip to form the light-emitting diode and during proper use of the light-emitting diode. Fixing may proceed, for example, by a hard, grindable material such as silazane. This material may, for example, also introduced into the suspension in particle form and be deposited onto the outer face of the light-emitting diode chip together with the luminescent material particles during electrophoretic deposition. Fixing of the luminescent material on the outer face of the light-emitting diode chip then proceeds, for example, by subsequent heating of the light-emitting diode chips together with the particles deposited on the outer face of the light-emitting diode chip.

Fixing is also possible using materials such as silicone or hybrid materials (for example, epoxy-silicone hybrid material). These materials may, for example, be applied to the deposited layer in the form of potting material. The material protects the luminescent material or the luminescent materials from external influences and facilitates adhesion to the light-emitting diode chip.

The particles may be removed in places after fixing. Removal may proceed, for example, by grinding, laser ablation or laser drilling. It is possible in this case, for example, for the thickness of the layer formed with the particles of the at least one luminescent material to be reduced in places or uniformly. In this way, subsequent color correction of the mixed light emitted by the light-emitting diode chip is possible. This removal may, for example, also take place in the wafer assembly such that a uniform thickness can be established for the layer of particles of the luminescent material for all the light-emitting diode chips. It is also possible, for example, for the mixed light emitted by the light-emitting diode chips and the layer to be measured photometrically during layer removal and in this way for a specific color location to be established for the emitted mixed light by measurement and material removal.

It is possible, moreover, for material of the layer comprising the luminescent material particles to be removed in places, for example, by laser drilling such that after removal the layer has openings in which the outer face is free of the material. This also makes it possible, for example, to produce a photonic crystal structure, as explained above.

The method described here and the light-emitting diode chip described here are distinguished inter alia by the following advantages:

The method makes it possible to produce white light-emitting diode chips for which it is unnecessary, after singulation from the assembly, to apply a further conversion material, for example, in the form of a plate, to the outer face of the light-emitting diode chip.

The method described here can be used for all chip sizes, in particular also for small chips with edge lengths of less than 500 µm.

The particles of the at least one luminescent material may be applied to the outer face of the light-emitting diode chip in high packing density. This ensures a particularly good thermal connection to the light-emitting diode chip such that optimal heat dissipation from the luminescent material may take place when the light-emitting diode is in operation.

It is additionally possible for the light-emitting diode to be free of potting material since no matrix material has to be provided for introduction of a luminescent material. All in all, it is possible to dispense with a matrix material for the luminescent material, which in turn allows a particularly high packing density for the particles of luminescent material.

Side faces and not just major faces of the light-emitting diode chips can be coated with particles of the at least one luminescent material. This results in a homogeneous color location over a large viewing angle and "blue piping", where the light emitted at the edge of the light-emitting diode chip appears blue, can be avoided.

In addition, a plurality of light-emitting diode chips can be produced simultaneously with a tight color location distribution. This increases yield and facilitates subsequent use of the light-emitting diode chips in the light-emitting diodes. Using an artificial wafer as the assembly which is the form taken by the light-emitting diode chips allows the color location distribution to be tightened further.

In addition, the color location may subsequently be adjusted by removing the particles of the luminescent material in some places.

Finally, production using a wafer assembly, i.e. electrophoretic deposition on a plurality of light-emitting diode chips, has proven particularly cost-effective.

The method described herein and the light-emitting diode described herein are explained in greater detail below with reference to examples and the associated figures.

Identical, similar or identically acting elements are provided with identical reference numerals in the figures. The figures and the size ratios of the elements illustrated in the figures relative to one another are not to be regarded as being to scale. Rather, individual elements may be illustrated on an exaggeratedly large scale for greater ease of depiction and/or better comprehension.

Figure 1:
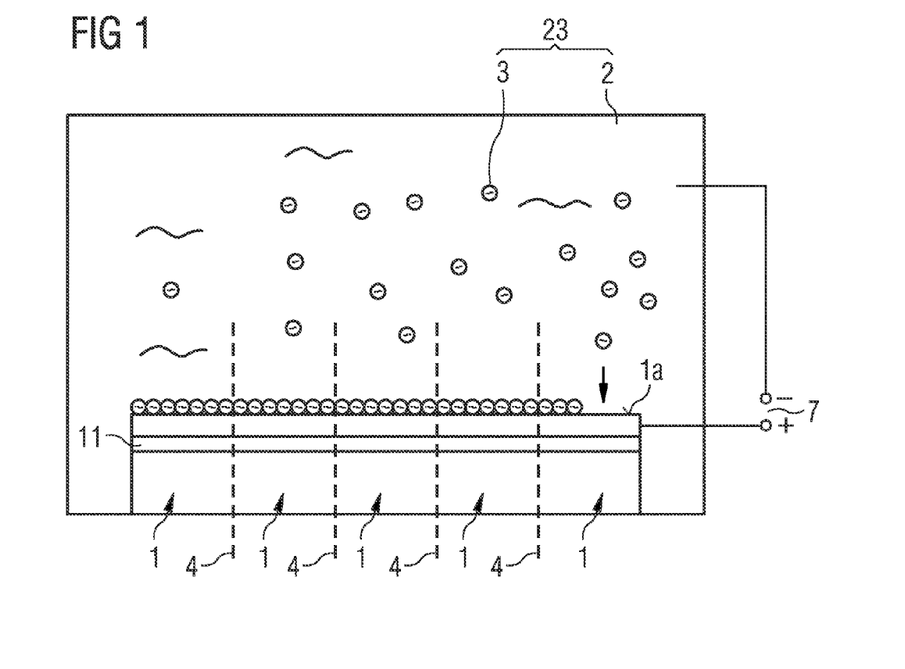
FIGS. 1 and 2 show schematic sectional illustrations of examples of methods described herein.

FIG. 1 shows by way of a schematic sectional representation a first example of a method described herein. In the method, a plurality of light-emitting diode chips 1, which take the form of an assembly in wafer form, are arranged in a suspension 23. Each light-emitting diode chip comprises at least one active layer 11 in which primary radiation, for example, blue light and/or UV radiation is generated when the light-emitting diode chip is in operation. The light-emitting diode chips have an outer face 1a. The outer face 1a is formed, for example, by a semiconductor material of the light-emitting diode chip. It is additionally possible for an electrically conductive material such as, for example, a transparent conductive oxide to be arranged on the outer face 1a. The outer face 1a of the light-emitting diode chips in assembly form connects to a voltage source 7. The suspension 23 likewise connects to the voltage source.

The suspension 23 is composed of a solvent 2 in which particles 3 of at least one luminescent material are dissolved.

When a voltage is applied by the voltage source 7, the particles 3 begin to be deposited from the suspension 2 on the outer face 1a of the light-emitting diode chips 1. This method is performed until a desired layer thickness and/or a desired density of the particles 3 is reached on the outer face 1a.

Once the method is terminated, the light-emitting diode chips are removed as the assembly from the suspension and singulated along the singulation lines 4 to form individual chips. The light-emitting diode chips can then be installed in a package (not shown).

Figure 2:
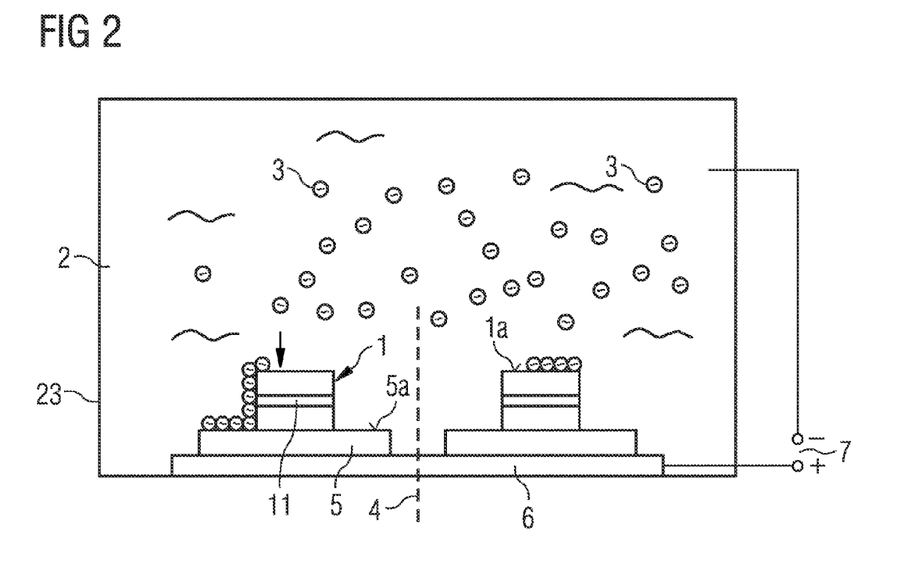

A further example of a method described herein is explained in greater detail in relation to FIG. 2. Unlike in the example of FIG. 1, the light-emitting diode chips 1 do not take the form of a wafer assembly, but rather of light-emitting diodes, comprising a package 5, and light-emitting diode chips 1 are arranged as an assembly in the suspension 23. To this end, the light-emitting diodes are applied to a carrier 6, for example. When a voltage is applied via the voltage source 7, particles of the at least one luminescent material are deposited from the suspension 23 onto the outer face 5a of the package 5 and the outer face 1a of the light-emitting diode chips 1. The particles 3 are in this case deposited on electrically conductive areas of these components.

Figure 3A:
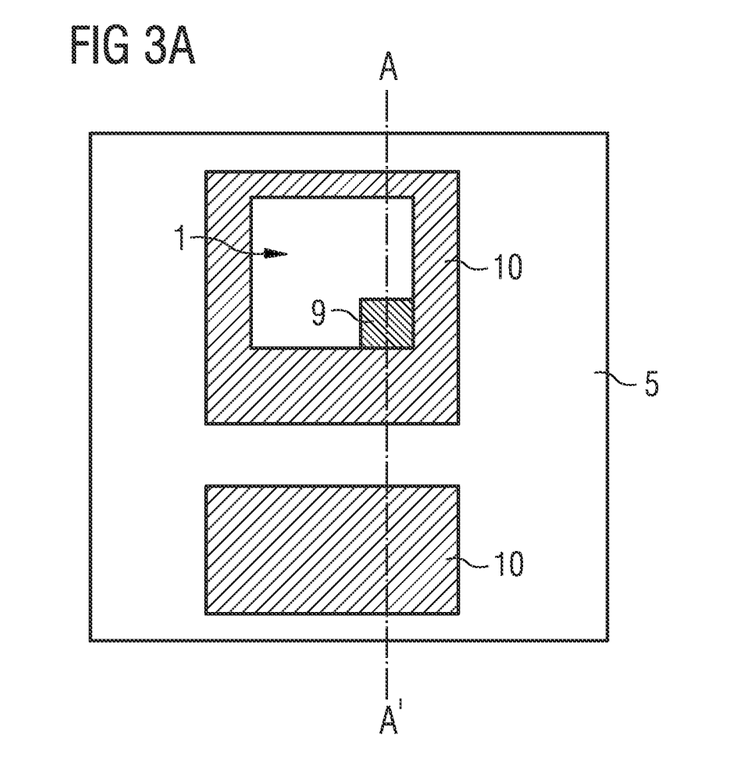
FIGS. 3A and 3B show schematic illustrations of an example of a light-emitting diode described herein.
Figure 3B:
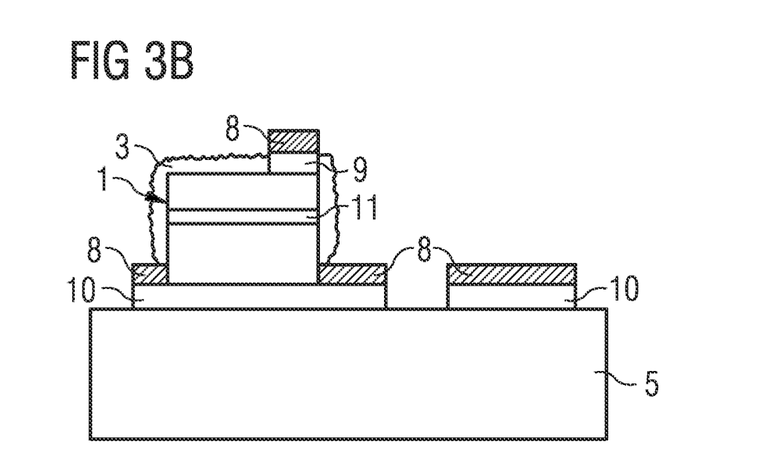

A light-emitting diode is described in relation to FIGS. 3A and 3B in which particles 3 are prevented from being deposited on areas where deposition is not wanted. The light-emitting diode comprises a package 5 which in this case takes the form of a connection carrier, on which metallized coatings 10 are present as connection points. As is apparent from the sectional representation of FIG. 3B, the metallized coatings 10 and an electrical connection point 9 of the light-emitting diode chip 1 are covered with an electrically insulating protective material 8 before the electrophoretic deposition of the particles 3 of the at least one luminescent material.

Due to the electrically insulating protective material 8 which, for example, is a structured photoresist, no particles 3 of the at least one luminescent material are deposited on the covered areas. After electrophoretic deposition of the particles 3, the electrically insulating protective material 8 may be removed. As is likewise apparent from FIG. 3A, main and side faces of the light-emitting diode chip 1 may be covered by luminescent material, i.e. the particles 3, using the methods described herein. In this way, a homogeneous color location of the light emitted by the light-emitting diode when in operation may be achieved over a large viewing angle.

Figure 4A:
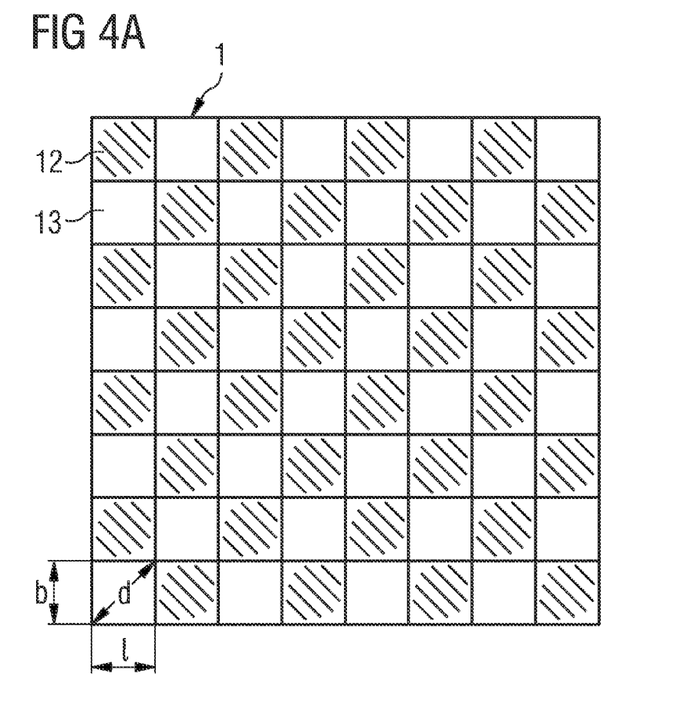
FIGS. 4A, 4B, 5A and 5B are schematic illustrations used to explain in greater detail further examples of methods described herein.

An example is described in relation to FIG. 4A in which first regions 12 with particles of a first luminescent material and second regions 13 with particles of a second luminescent material or no luminescent material are applied to the outer face of the light-emitting diode chip. A pattern is produced which, as described above, may be visible to the human observer even with the naked eye. It is also possible to produce photonic crystals which allow particularly loss-free light emission.

The length l and width b or the diameter d of the regions can be selected in accordance with the luminescent material used and the desired emission pattern. For example, the edge length of the light-emitting diode chip 1 amounts to 300 µm, and the width b and the length l amount in each case to 50 µm, i.e. even particularly small chips may be covered with a pattern of particles of different luminescent materials. The luminescent materials may, for example, emit red light or green light as a result of excitation with blue light. Owing to the arrangement of different luminescent materials in different regions, any absorption of already converted light is minimized.

Figure 4B:
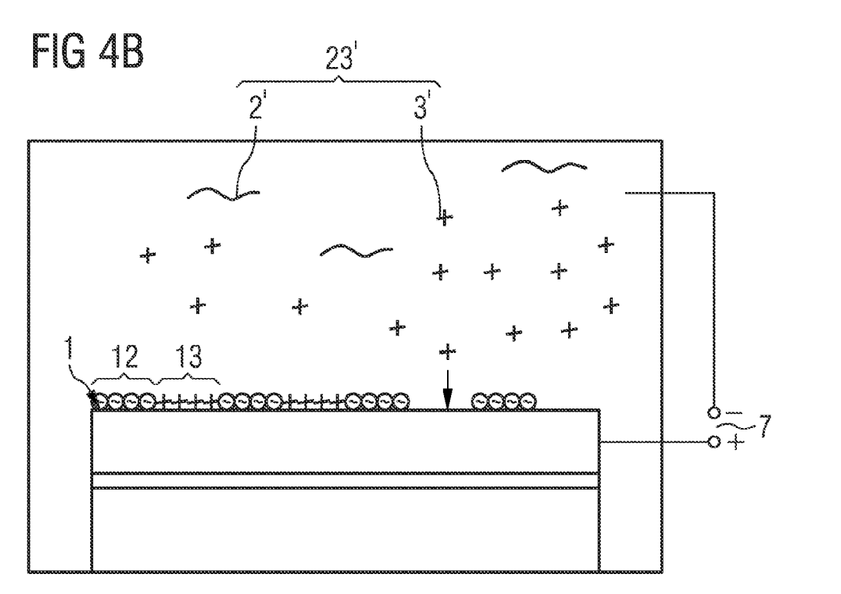

FIG. 4B is a schematic representation of a possible production method for such a light-emitting diode chip. The light-emitting diode chip, for instance as an assembly may, for example, be arranged in a suspension 23' containing particles 3' of a further luminescent material. Regions 13 with the second luminescent material may thus be produced. These regions are covered during deposition of the first luminescent material in the first regions 12, for example, with an electrically insulating protective material 8 such as, for example, a photoresist removed prior to application of the particles of the second luminescent material.

Figure 5A:
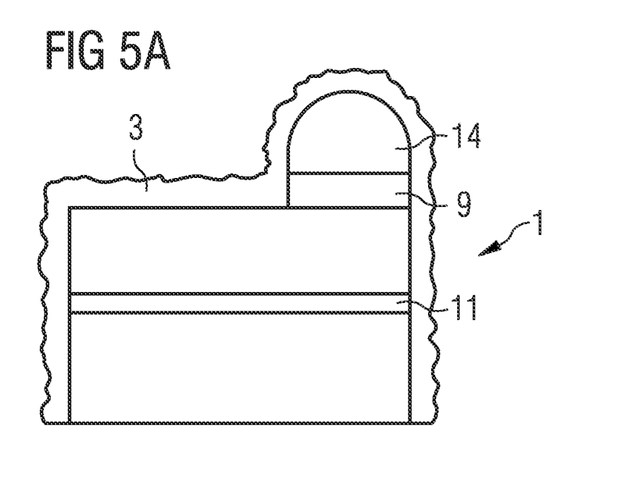
Figure 5B:
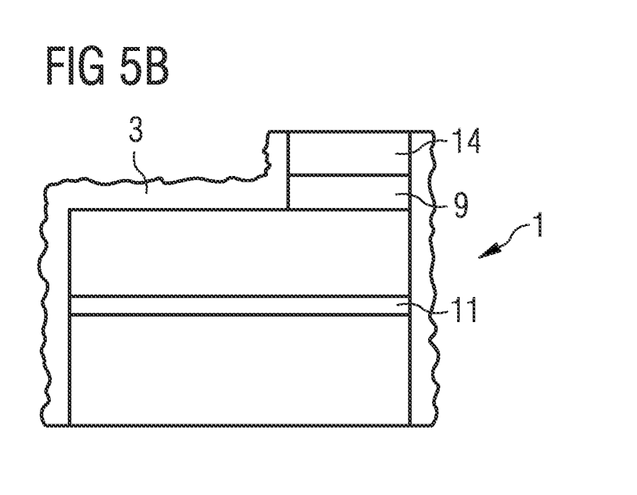

A further production method for a light-emitting diode described here is explained in greater detail with reference to FIGS. 5A and 5B. In this production method, a contact point 9 of a light-emitting diode chip 1 is covered with an electrically conductive protective material 14, for example, a gold bump. During electrophoretic deposition, this electrically conductive gold bump is also coated with the particles 3 of the at least one luminescent material. Then the electrically conductive protective material 14 is removed at least in part, for example, by grinding. It is thus possible to uncover, for example, a wire-contactable area on the top of the electrically conductive material 14 remote from the light-emitting diode chip 1. This area is then wire-contactable without any further measures.

The description made with reference to examples does not restrict our light-emitting diodes or methods to these examples. Rather, this disclosure encompasses any novel feature and any combination of features, including in particular any combination of features in the appended claims, even if the feature or combination is not itself explicitly indicated in the claims or examples.

The invention claimed is:

1. A method of producing a light-emitting diode comprising:
    providing at least one light-emitting diode chip,
    applying an electrically conductive protective material to parts of an outer face of each light-emitting diode chip,
    providing a suspension comprising a solvent and particles of at least one luminescent material,
    arranging the at least one light-emitting diode chip in the suspension,
    electrophoretically depositing the particles on an outer face of the at least one light-emitting diode chip,
    fixing the particles on the outer face after depositing the particles,
    removing the particles in places from the outer face after fixing the particles,
    removing the electrically conductive protective material after the electrophoretic deposition, and
    completing the light-emitting diode.

2. The method according to claim 1, wherein a plurality of light-emitting diode chips are arranged jointly in the suspension.

3. The method according to claim 2, wherein the light-emitting diode chips are in the form of an assembly during electrophoretic deposition and are singulated into individual light-emitting diode chips after electrophoretic deposition.

4. The method according to claim 1, wherein each light emitting diode chip is arranged in a package.

5. The method according to claim 4, wherein the particles are deposited electrophoretically in places on an outer face of the package.

6. The method according to claim 4, wherein the electrically conductive protective material is applied to parts of the outer face of each light-emitting diode chip and of the package, which protective material is removed after the electrophoretic deposition.

7. The method according to claim 1, further comprising, after removal of the electrically conductive protective material, and before completion of the light-emitting diode:
    providing a further suspension comprising a solvent and particles of at least one further luminescent material,
    arranging the at least one light-emitting diode chip at least in part in the further suspension, and
    electrophoretically depositing the particles of the at least one further luminescent material on an outer face of the at least one light-emitting diode chip.

8. Method according to claim 7, wherein the particles of the at least one luminescent material and the particles of the at least one further luminescent material on the outer face of the at least one light-emitting diode chip form a pattern of first regions with particles of a first luminescent material and second regions with particles of a second luminescent material.

9. The method according to claim 8, wherein the pattern forms at least one photonic crystal.

10. The method according to claim 1, wherein the electrically conductive protective material is applied to an electrical connection point on an outer face of each light-emitting diode chip before the electrophoretic deposition and after the electrophoretic deposition the particles deposited on the electrically conductive protective material are removed by partial removal of the electrically conductive protective material.

11. A method of producing a light-emitting diode comprising:
    providing at least one light-emitting diode chip, wherein each light emitting diode chip is arranged in a package,
    applying an electrically conductive protective material to parts of an outer face of the package,
    providing a suspension comprising a solvent and particles of at least one luminescent material,
    arranging the at least one light-emitting diode chip in the suspension,
    electrophoretically depositing the particles on an outer face of the at least one light-emitting diode chip,
    fixing the particles on the outer face after depositing the particles,
    removing the particles in places from the outer face after fixing the particles,
    removing the conductive protective material after the electrophoretic deposition, and
    completing the light-emitting diode.

* * * * *